United States Patent [19]
Hirose et al.

[11] Patent Number: 4,938,940
[45] Date of Patent: Jul. 3, 1990

[54] VAPOR-PHASE METHOD FOR SYNTHESIS OF DIAMOND

[75] Inventors: Yoichi Hirose, 358-225, Showa-machi, Komejima, Kitakatsushika-gun, Saitama-ken; Kunio Komaki, Kanagawa, both of Japan

[73] Assignees: Yoichi Hirose, Saitama; Showa Denko K.K., Tokyo, both of Japan

[21] Appl. No.: 296,140

[22] Filed: Jan. 12, 1989

[30] Foreign Application Priority Data

Jan. 14, 1988 [JP] Japan .................................. 63-4780
Mar. 28, 1988 [JP] Japan .................................. 63-71758

[51] Int. Cl.$^5$ .............................................. C30B 29/04
[52] U.S. Cl. ............................ 423/446; 156/DIG. 68; 427/34; 427/249; 501/86
[58] Field of Search ........................ 423/446; 501/86; 156/DIG. 68; 427/249, 34

[56] References Cited

U.S. PATENT DOCUMENTS

| 3,030,187 | 4/1962 | Eversole | 423/446 |
|---|---|---|---|
| 3,030,188 | 4/1962 | Eversole | 423/446 |
| 3,371,996 | 3/1968 | Hibshman | 423/446 |
| 3,661,526 | 5/1972 | Angus et al. | 423/446 |
| 3,705,937 | 12/1972 | Dzevitsky | 423/446 |
| 3,714,334 | 1/1973 | Vickery | 423/446 |
| 4,816,286 | 3/1989 | Hirose | 423/446 |

FOREIGN PATENT DOCUMENTS

| 61-163195 | 7/1986 | Japan | 423/446 |
|---|---|---|---|
| 61-286299 | 12/1986 | Japan | 423/446 |
| 62-113796 | 5/1987 | Japan | 423/446 |
| WO8703307 | 6/1987 | PCT Int'l Appl. | 423/446 |
| 1349832 | 4/1974 | United Kingdom | 423/446 |

Primary Examiner—John Doll
Assistant Examiner—Robert M. Kunemund
Attorney, Agent, or Firm—Oblon, Spivak, McClelland, Maier & Neustadt

[57] ABSTRACT

A method for vapor-phase synthesis of diamond comprises burning a raw material compound for synthesis of diamond thereby forming a combustion flame, disposing a substrate for deposition of diamond in said combustion flame, and keeping said substrate at a prescribed temperature, thereby inducing deposition of diamond on said substrate.

8 Claims, 5 Drawing Sheets

VAPOR-PHASE METHOD FOR SYNTHESIS OF DIAMOND

BACKGROUND OF THE INVENTION

1. Field of the Invention

This invention relates to a vapor-phase method for the synthesis of diamond films or granules possessing abrasive wear resistance, corrosionproofness, high thermal conductivity, and high specific Young's modulus and finding utility in abrasive materials, grinding materials, optical materials, super hard material tools, sliding materials, corrosionproofing materials, acoustic vibration materials, blade edge components, etc.

2. Prior Art Statement

Up to now synthesis of diamond has been carried out either by synthesis under extremely high pressure in the presence of a catalyst of iron or nickel or by direct conversion of graphite by the impact of explosion.

In the art of low-pressure CVD, recent years have seen progress in the development of a method for synthesizing diamond by imparting an excited state to a gaseous mixture of hydrogen with a hydrocarbon or an organic compound containing nitrogen, oxygen, etc. by means of a hot filament, a microwave plasma, a high-frequency plasma, a direct-current discharge plasma, or a direct-current arc discharge.

The conventional CVD method mentioned above has required a special apparatus for exciting the raw material gas to an extent sufficient for synthesis of diamond. No matter which of the aforementioned sources of excitation may be employed, it is difficult to obtain large-area diamond deposition.

OBJECT AND SUMMARY OF THE INVENTION

The inventors, after a study continued for the purpose of developing a method for vapor-phase synthesis capable of forming a diamond film of large surface area by a simple means as compared with the conventional method, found that the synthesis aimed at is accomplished by burning a raw material compound and forming an incomplete combustion region and disposing a substrate for diamond deposition in the region or in the vicinity of the region under specific conditions. This invention has been perfected as the result.

The inventors continued various studies on the low-pressure CVD method, particularly on the means of excitation, and drew the conclusion that the state of plasma such as, for example, the heat plasma with a hot filament, the microwave plasma with a microwave, or the arc discharge plasma with a direct-current arc discharge, has a significant bearing upon the synthesis of diamond. Consequently, they presumed that since the combustion flame by burning is similarly in the state of plasma, the use of the combustion flame ought to permit easy synthesis of diamond as compared with the conventional method, and pursued a study based on this theory. As a result, they perfected this invention.

To be specific, this invention is directed to a method for the vapor-phase synthesis of diamond, which is characterized by burning a raw material for deposition of diamond thereby forming a combustion flame, disposing a substrate for diamond deposition in the combustion flame, and retaining this substrate at a temperature for diamond deposition thereby causing deposition of diamond on the substrate.

The diamond synthesized by the method of this invention embraces diamond-like carbons such as i-carbon.

The above and other objects and features of the invention will become more apparent from the following detailed description with reference to the accompanying drawings.

DETAILED DESCRIPTION OF THE PREFERRED EMBODIMENTS

Figure 1:
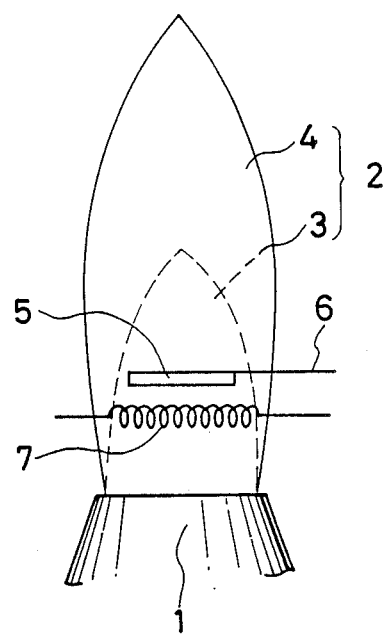
FIG. 1 is an explanatory diagram illustrating a typical apparatus for working the present invention.

The raw material gas for the synthesis of diamond will now be described below, starting with carbon sources.

(a) Hydrogen-containing compound:

Saturated hydrocarbons: Methane, ethane, propane, butane, etc.

Unsaturated hydrocarbons: Ethylene, propylene, butylene, acetylene, arylene, etc.

Aromatic hydrocarbons: Benzene, toluene, xylene, cyclohexane etc.

CHO compounds: Alcohols such as methanol, ethanol, propanol, butanol, and ether group-containing compounds.

Ketone group-containing compounds: Acetone, methyl ethyl ketone, diethyl ketone, 2,4-pentanedione, and 1'-butyronaphthone.

Esters: Methyl acetate, ethyl acetate, and isoamyl acetate.

Ketene group-containing compounds: Dimethyl ketene and phenyl ketene.

Acetyl group-containing compounds: Acetic acid, acetic anhydride, acetophenone, and biacetyl.

Aldehyde group-containing compounds: Formaldehyde, acetaldehyde, and propionaldehyde.

Methylene group-containing compounds: Ketene and diazo methane.

Methyl group-containing compounds: t-Butyl peroxide, methyl hydroperoxide, and peracetic acid.

(b) Nitrogen-containing compounds:

Primary amines: Methylamine, ethylamine, dimethylamine, trimethylamine, and isopropylamine.

Nitrile group-containing compounds: Acetonitrile, benzonitrile, acrylonitrile, and pivalonitrile.

Amide group-containing compounds: Hexaneamide and acetamide.

Nitro group-containing compounds: Nitroethane, nitromethane, nitrosobenzene, and nitropropane.

(c) Oxygen-containing compounds: Carbon monoxide.

The compounds enumerated above can be used either singly or in combinations of two or more.

Among the various compounds mentioned above, methane, ethane, propane, acetylene, ethylene, butane methyl alcohol, and ethyl alcohol prove to be used advantageously from the practical point of view.

The compound selected as a carbon source as described above, when necessary, is mixed with oxygen and further with such a non-oxidative gas such as, for example, $H_2$, Ar, $N_2$, Co, $CO_2$, or $H_2O$. The resultant gaseous mixture is burnt in an atmosphere containing or not containing oxygen.

A solid carbon or graphite may be used as a carbon source in the combustion flame of a mixed gas of the aforementioned compound with hydrogen and oxygen through such a reaction as gasification, combustion, or hydrogenation. In the above case, a non-oxidative gas may be further mixed with the aforementioned compounds.

Generally, the combustion flame comprises an incomplete combustion region, a complete combustion region, and an excess-oxygen combustion region. The method of this invention starts with the step of disposing a substrate for the deposition of diamond in the incomplete combustion region. The deposition of diamond is also obtainable by disposing the substrate in the complete combustion region. Further, the deposition of diamond is obtainable by disposing part of the substrate in the excess-oxygen region, and adjusting the temperature of the substrate, for example, by cooling with water.

The formation of an incomplete combustion region in which the raw material gas for the synthesis of diamond mixed with oxygen is excited by combustion to the state of diamond deposition either in an atmosphere containing no oxygen or in an atmosphere containing oxygen actually takes place in the form of a combustion performed in an atmosphere of argon or in the form of a combustion performed in the open air.

When acetylene, ethylene, propane, or alcohol mixed with oxygen is burned in open air to form a combustion flame, the volume of the incomplete combustion region in the combustion flame can be controlled by adjusting the amount of the oxygen mixed to the gaseous carbon source. The incomplete combustion region formed in the acetylene-oxygen flame in this case is called an "acetylene feather". The volume of this incomplete combustion region can be varied and controlled by controlling the oxygen/acetylene ratio and the total flow volume of the gases. Particularly, the oxygen/acetylene ratio can be varied in the range of 0.5 to 2, preferably 0.75 to 1.2. At this time, the temperature of the acetylene feather is no less than 2,000° C., specifically in the neighborhood of 2,500° C. No auxiliary means of excitation is required. Suitably the temperature of the substrate is in the range of 600° to 1,200° C. It can be controlled to fall in this range by cooling the substrate with water.

The synthesis of diamond may be otherwise attained by using the raw material gas for the synthesis of diamond without addition of oxygen and burning this gas in an oxygen-containing atmosphere.

FIG. 1 is an explanatory diagram illustrating a typical apparatus for carrying out the method of this invention.

In the diagram, 1 stands for a burner and 2 for a combustion flame which comprises an incomplete combustion region 3, called an inner flame, and an outer flame 4 consisting of a substantially complete combustion region and an excess-oxygen combustion region. A substrate 5 is attached to a substrate-supporting rod 6 in the illustrated embodiment. A tungsten wire filament 7 serves as an auxiliary excitation means where the combustion flame alone does not suffice for the excitation to a state suitable for the formation of diamond.

The substrate for diamond deposition denoted by 5 in the diagram may be any of the materials heretofore used for synthesis by low-pressure CVD. As concrete examples of the substrate, there may be cited shaped articles and granular articles such as Si wafer, sintered SiC article, granular SiC, W, WC, Mo, TiC, TiN, thermet, ultra-hard special tool steels, special tool steels, and high-speed steel.

In the combustion flame, the deposition of diamond takes place mainly in the oxygen-deficient region, i.e. the incomplete combustion region, generally called an inner flame and denoted by 3 in the diagram. The deposition of diamond can also be obtained in the portion of the complete combustion region close to the incomplete combustion region. Generally, the excessoxygen combustion region is extremely hot so that any diamond formed is consumed in combination with excess oxygen and is passed out in the form of CO or $CO_2$. Under certain conditions, there is obtained diamond having trace etched, depending on the ratio of the amount of diamond deposited and the amount of diamond lost. The incomplete combustion region in which the deposition of diamond takes place easily is deficient in oxygen and has a relatively low temperature. In this region, the raw material gas is required to be excited to the conditions fit for the formation of hydrocarbon radicals (activated species). For the method of this invention, the substrate for diamond deposition is desired to be disposed at a portion of the flame in which the temperature is in the range of 300° to 1,400° C.

When the excitation attained in this state is not sufficient, an electric current heating, a high-frequency induction heating, a laser beam, an infrared ray, or an arc discharge may be used as an auxiliary heating source.

Specifically, the temperature of the heating region has to exceed 1,000° C., preferably 1,500° C., and the temperature of the substrate to be between 500° C. and 1,400° C., preferably between 600° C. and 1,200° C.

No auxiliary excitation means is required where the excitation is amply obtained with large energy at a high temperature as in the case of the combustion flame of a mixed gas consisting of acetylene, ethylene, propylene, alcohol, or benzene with oxygen. The deposition of diamond over a large surface area is enabled to proceed with enhanced uniformity and increased speed by superposing other excitation energy such as plasma on the combustion.

The pressure under which the flame is made to form can be selected in the range of 0.1 to 10,000 Torr, preferably 10 to 760 Torr. The synthesis under normal pressure (760 Torr) is highly advantageous from the practical point of view because it can be performed in the open air.

It is presumed that the mechanism of synthesis of diamond by the method of this invention is that the carbon-containing raw material compound in the combustion flame undergoes decomposition and dissociation through reaction with oxygen and gives rise to radical species of activation and the radical species combine as with C, $C_2$, CH, $CH_2$, or $CH_3$ and forms a diamond phase.

The reactions involved herein also form hydrogen atoms and oxygen atoms, which are believed to participate in the reaction for the deposition of diamond.

This invention permits the vapor-phase synthesis of diamond to be attained with a simple apparatus and even permits this synthesis to be carried out on a large scale suitable for commercialization. The diamond, therefore, can be produced with a homogeneous quality over a large surface area. The deposition of diamond proceeds quickly irrespective of whether the product formed is a film or granules. It is not obstructed at all when the surface of the film is curved. By the method of this invention, therefore, diamond films and granules and can be obtained easily as compared with the conventional vapor-phase method.

EXAMPLE 1

An apparatus constructed as illustrated was used. To be specific, an ordinary oxyhydrogen burner was fixed in place, a 7 mm square Si wafer substrate fastened to a SUS plate was fixed in place 7 mm above the burner nozzle, and a tungsten wire 0.3 mm in diameter was placed as an auxiliary heater 5 mm above the burner nozzle and 2 mm below the Si wafer substrate.

Hydrogen was fed to the burner at the rate of 2,000 cc/min. and methane at a rate of 50 cc/min. in the form of a mixed gas (methane/hydrogen 2.5 vol%) and burned in the open air. The tungsten wire was heated and held at 2,200° C. The temperature of the Si wafer was about 900° C.

The combustion thus produced was allowed to continue for 24 hours.

Figure 2:
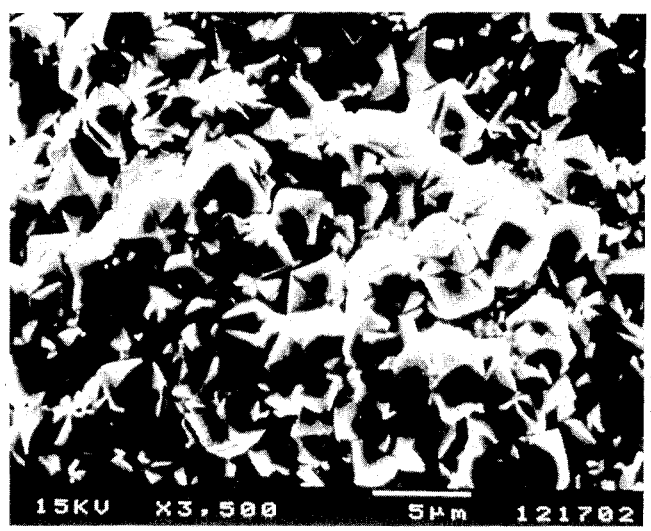
FIG. 2 is a scanning electron micrograph illustrating at 3,500 magnifications a crystalline structure of the diamond film deposited in Example 1.

A scanning electron micrograph (3,500 magnifications) illustrating the crystalline structure of the deposit formed on the Si wafer after completion of the combustion is shown in FIG. 2.

Figure 4:
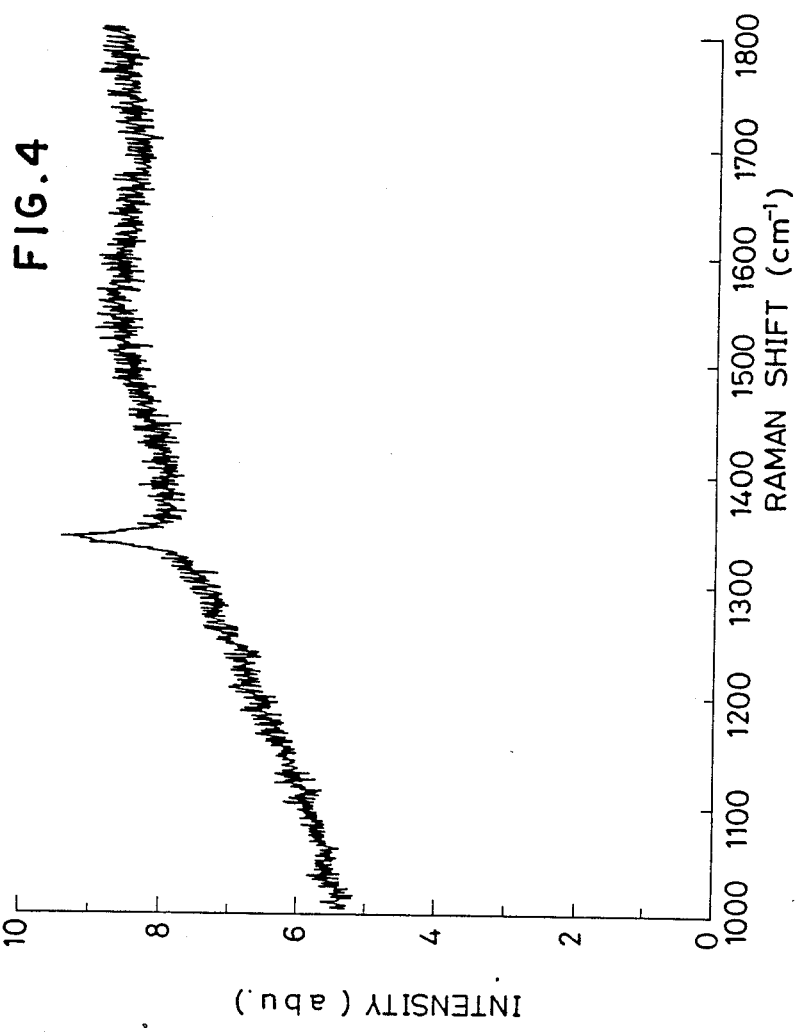
FIG. 4 is a Raman spectrum of the diamond film deposited in Example 1.

In the diagram, a diamond film of high crystallinity abounding with diamond automorphic (111) faces is recognized. A Raman spectrum of the surface of this diamond film is illustrated in FIG. 4. This diagram shows a peak of diamond at 1,334 cm$^{-1}$ and a broad low peak of i-carbon near 1,550 cm$^{-1}$. The thickness of the deposited diamond film was about 2 $\mu$m.

EXAMPLE 2

The procedure of Example 1 was repeated, except that the mixed gas fed to the burner was composed of hydrogen supplied at the rate of 2,000 cc/min., methane supplied at the rate of 50 cc/min. (2.5 vol% based on hydrogen), and oxygen supplied at the rate of 5 cc/min. (0.25 vol% based on hydrogen). When the surface of the deposit formed on the Si wafer was observed under a scanning electron microscope, the formation of a film of high crystallinity possessing the same automorphic faces of diamond as in Example 1 was confirmed. The Raman spectrum of the surface of the film was identical to that of Example 1. The diamond film thus deposited had a thickness of about 3 $\mu$m.

EXAMPLE 3

Figure 3:
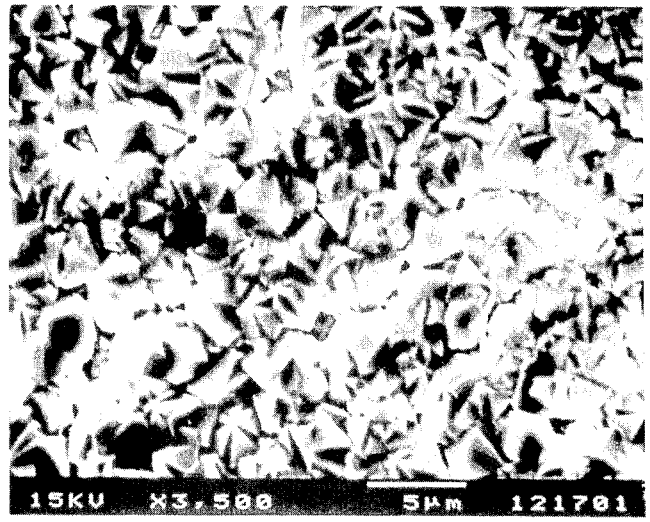
FIG. 3 is a scanning electron micrograph illustrating at 3,500 magnifications the crystalline structure of the diamond film deposited in Example 3.

The procedure of Example 1 was repeated, except that the mixed gas fed to the burner was composed of hydrogen supplied at the rate of 2,000 cc/min. and methyl alcohol supplied at the rate of 50 cc/min. A scanning electron micrograph (3,500 magnifications) of the crystalline structure of the surface of the deposit on the Si wafer is illustrated in FIG. 3. The diagram shows the formation of a diamond film of high crystallinity abounding with automorphic (111) faces of diamond similar to those of FIG. 2. The Raman spectrum of the deposited diamond film was substantially identical to that in Example 1. The thickness of the deposited diamond was about 1 $\mu$m.

EXAMPLE 4

A mixed gas consisting of hydrogen supplied at the rate of 2,000 cc/min., methane supplied at the rate of 50 cc/min. (2.5 vol% based on hydrogen), and oxygen supplied at the rate of 200 cc/min. (10 vol% based on hydrogen) was fed to the same burner as used in Example 1 and burned to form a combustion flame in an atmosphere of argon of 100 Torr. A wafer was placed 20 mm above the burner nozzle. A tungsten wire 0.3 mm in diameter was placed as an auxiliary heater 15 mm above the burner nozzle and 5 mm below the substrate, heated, and kept at 2,200° C. The reaction was continued for 2 hours. The formation of a film possessing automorphic faces similarly to Examples 1 and 3 was recognized. In the laser Raman spectrum of the deposited film, a peak of diamond is found at 1,333 cm$^{-1}$ and a weak broad peak of diamond-like carbon near 1,550 cm$^{-1}$. The thickness of the film was about 1 $\mu$m.

EXAMPLE 5

Figure 5:
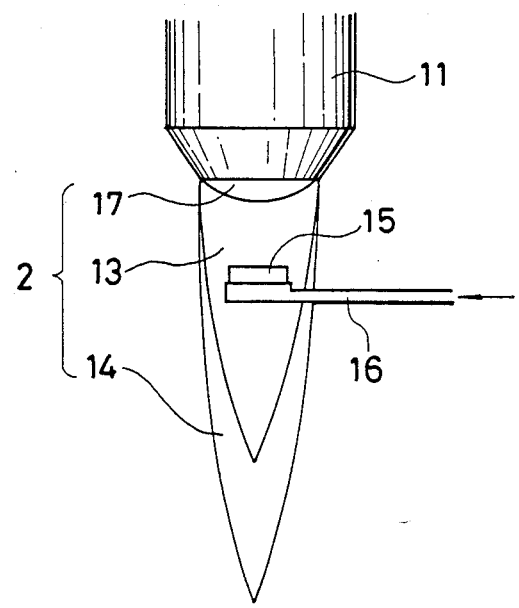
FIG. 5 is an apparatus used for working Example 5.

Synthesis of diamond according to the present invention was carried out by using an apparatus illustrated in FIG. 5 and using acetylene and oxygen as the raw material gas for diamond deposition. An acetylene burner 11 was fixed in place with the leading end thereof held downwardly and a Si substrate 15 having a surface area of the square of 12 mm and fixed on a water-cooled substrate supporting base 16 was placed opposite the burner nozzle. Acetylene was supplied at the rate of 1.5 liters/min. and oxygen at the rate of 1.2 liters/min. (oxygen/acetylene ratio 0.8) to the burner and burned there. Consequently, a combustion flame consisting of an incandescent core 17, an acetylene feather 13 about 60 mm in length, and an outer flame 14 was formed on the nozzle. The combustion thus produced was allowed to continue for 30 minutes. The surface of a deposit formed on the Si substrate after completion of the combustion was observed under an optical microscope. It was consequently confirmed that the entire surface of the Si substrate was covered with a film possessing automorphic diamond faces. This film was deposited on the substrate with sufficient fastness. The Raman spectrum of this diamond film was substantially identical to those of Example 1 illustrated in FIG. 4. The thickness of the diamond film was about 75 $\mu$m.

EXAMPLE 6

An acetylene-propane burner was fixed in place, with the nozzle thereof turned upwardly. A Si wafer substrate attached to a water-cooled substrate supporting base was set in place opposite the nozzle at a distance of 15 mm from the nozzle. Ethylene was supplied at the rate of 2,000 cc/min. and oxygen at 1,600 cc/min. (oxygen/ethylene ratio 0.8) to the burner and burned in the open air for 15 minutes. The deposited film on the Si wafer substrate after completion of the combustion was found by X-ray diffraction and Raman spectrometry to be a diamond deposit containing an i-carbon in a small amount. The thickness of this deposit was about 28 $\mu$m.

EXAMPLE 7

The procedure of Example 6 was repeated, except that a propane burner was used and propane was supplied at the rate of 1,800 cc/min. and oxygen at the rate of 2,000 cc/min. to the burner. The deposited film on the substrate after completion of the combustion was found to be identical in composition to that of Example 6. The diamond thus deposited was found to be slightly better than that of Example 6 in homogeneity. The thickness of the film was about 31 µm.

EXAMPLE 8

Figure 6:
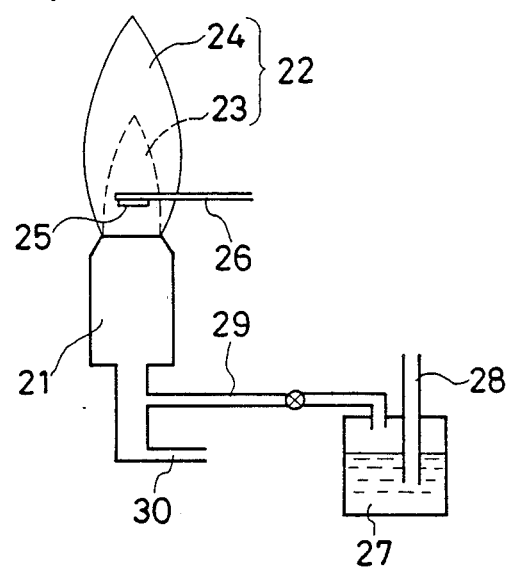
FIG. 6 is an apparatus used for working Example 8.

A burner 21 constructed as illustrated in FIG. 6 was used. An ultra-hard cutter 25 attached fast as a substrate to a water-cooled supporting base 26 was set in place 10 mm above the nozzle. In this apparatus, benzene in a liquid state at normal room temperature was used as a raw material to effect synthesis of diamond according to the present invention. To be specific, benzene was placed in a liquid raw material gasifying tank 27, argon gas was introduced into the benzene through a liquid raw material gasifying inlet tube 28, and the tank 27 was heated to produce a benzene-argon gas (consisting of 600 cc of benzene and 200 cc of argon in feed rate per min.). This gas was introduced through a gasified liquid raw material tube 29 and, at the same time, oxygen (1,600 cc/min.) was introduced through a gas inlet tube 30 into the burner 21 and burned in the open air for 15 minutes. In the combustion, a combustion flame 22 comprising an inner flame 23 and an outer flame 24 was formed. The film formed on the ultra-hard cutter after completion of the combustion was found by the same analysis as in Example 6 to be a compact diamond having a crystal size of 5 to 6 µm and containing i-carbon. The thickness of this film was about 37 µm.

EXAMPLE 9

Figure 7:
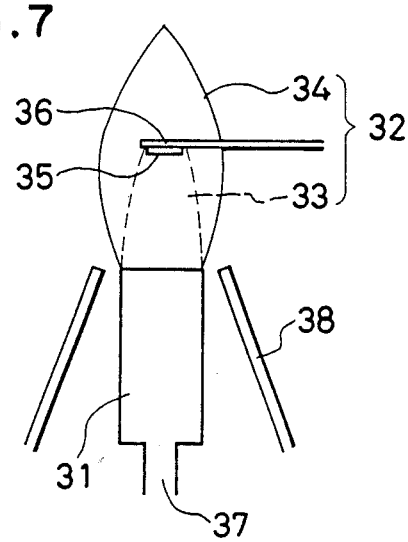
FIG. 7 is an apparatus used for working Examples 9 and 10.

Synthesis of diamond according to this invention was carried out with an apparatus constructed as illustrated in FIG. 7. To be specific, an oxygen-acetylene burner 31 provided with an ordinary gas inlet 37 was fixed in place and a 10 mm square ultra-hard alloy substrate 35 secured on a water-cooled copper substrate supporting base 36 was fixed in place 10 mm above the burner 45 nozzle. An additional gas nozzle 38 was disposed beside the burner nozzle. In the diagram, two such nozzles were disposed one each on the opposite sides of the burner. Optionally, a plurality of such nozzles may be disposed in such a manner as to surround the burner.

Acetylene was supplied at the rate of 2,000 cc/min. and oxygen at the rate of 1,500 cc/min. through the gas inlet 37 of the burner and steam was released through the additional gas nozzle at the rate of 3% by volume based on the oxygen to cause combustion in the open air. The substrate was kept at 1,050° C. by controlling the temperature of the supporting base with cooling water. In the combustion, a combustion flame 32 comprising an inner flame 33 and an outer flame 34 was formed.

The combustion thus produced was allowed to continue for 10 minutes. The deposit formed on the substrate after completion of the combustion was found under a scanning electron microscope to be a granular diamond (20 to 40 in particle diameter) of high crystallinity covered with automorphic diamond faces (100). The microscopic Raman analysis conducted on the diamond particles confirmed the product to be diamond of high quality showing a sharp peak of diamond at 1,334 cm$^{-1}$.

EXAMPLE 10

Synthesis of diamond according to the present invention was carried out by using an apparatus constructed as illustrated in FIG. 7. An oxygen-acetylene burner was used. A 10 mm square Si wafer substrate was placed at a distance of 30 mm from the nozzle of the burner. Acetylene was supplied at the rate of 2,000 cc/min. and oxygen at the rate of 1,800 cc/min. through the gas inlet 37 of the burner and hydrogen was released through the additional gas nozzle 38 at the rate of 15% by volume based on the oxygen to cause combustion in the open air. The temperature of the substrate was kept at 600° C.

When the deposit formed on the substrate after 15 minutes' combustion was observed under a scanning electron microscope, it was confirmed to be diamond abounding with automorphic diamond faces (111). The microscopic Raman analysis confirmed the presence of a sharp peak of diamond at 1,334 cm$^{-1}$. Thus, this product was identified to be diamond of fine quality. The thickness of the film was 20 µm.

EXAMPLE 11

Figure 8:
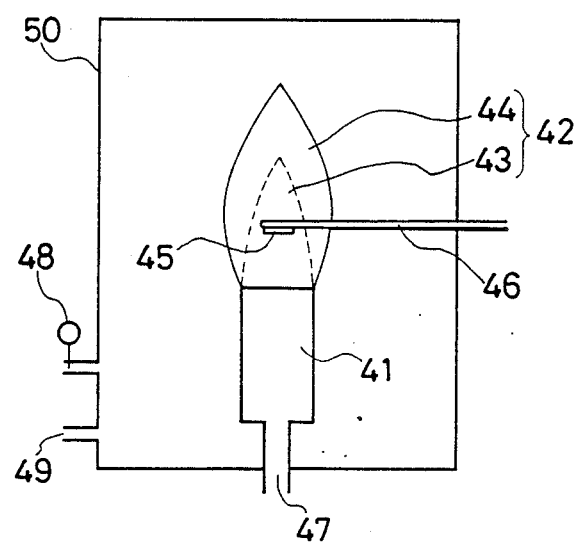
FIG. 8 is an apparatus used for working Examples 11 and 12.

Synthesis of diamond according to the present invention was carried out by using an apparatus constructed as illustrated in FIG. 8. The apparatus of FIG. 8 was substantially identical with that of FIG. 1, except that no tungsten filament was used and the burner was held in a reaction chamber 50 provided with an atmospheric gas inlet 49 and a pressure gauge 48.

The reaction chamber 50 was made of stainless steel. It had an inner volume of about 25 liters and measured about 30 cm in diameter and 35 cm in height. Inside this reaction chamber, a propane burner 41 was fixed in place and a sintered SiC substrate 45 secured on a water-cooled substrate supporting base 46 made of copper and measuring 10 mm by 10 mm by 2 mm was disposed opposite the nozzle. Argon gas was introduced through the atmospheric gas inlet 49 to form an atmosphere of argon of 900 Torr inside the reaction chamber. A mixed gas consisting of 1,600 cc of propane and 2,000 cc of oxygen as feed rate per minute (oxygen/propane ratio 1.25) was introduced into the burner and burned therein. In the combustion, a combustion flame 42 comprising an inner flame 43 and an outer flame 44 was formed. The temperature of the surface of the substrate was at 900° C. The combustion thus produced was allowed to continue for 30 minutes. After the completion of the combustion, the deposited film on the substrate was examined under a scanning electron microscope. It was found to be diamond containing automorphic diamond facets. This deposit was identified by the thin-film X-ray diffraction and the laser Raman spectroscopy to be diamond containing i-carbon. The thickness of the film was about 4 µm.

EXAMPLE 12

The procedure of Example 11 was repeated, except that an acetylene burner was used instead, the interior of the reaction chamber was composed of air at 400 Torr, and the substrate was made of a 10 mm square ultra-hard alloy fixed in place 30 mm above the nozzle. A mixed gas consisting of 2,000 cc of acetylene and 2,000 cc of oxygen (oxygen/acetylene ratio 1.0) in flow rate per minute was introduced to the burner and burned for 15 minutes. When the deposited film on the substrate after completion of the combustion was examined under an optical microscope, it was confirmed to be diamond abounding in automorphic diamond facets. By the thin-film X-ray diffraction and the laser Raman spectroscopy, the product was identified to be diamond containing i-carbon. The thickness of the film was about 12 μm.

What is claimed is:

1. A vapor-phase method for the synthesis of diamond, comprising the steps of burning a raw material compound in the presence of oxygen for deposition of diamond thereby forming a combustion flame containing at least an incomplete combustion region; disposing a substrate for deposition of diamond in said combustion flame, and maintaining said substrate at a temperature for deposition of diamond, thereby inducing deposition of diamond on said substrate.

2. A method according to claim 1, wherein said substrate for diamond deposition is disposed in said incomplete combustion region.

3. A method according to claim 1, wherein said raw material compound for deposition of diamond is burned so as to form a combustion flame comprising an incomplete combustion region and at least one of a complete combustion region and an excess-oxygen combustion region and said substrate is disposed outside of said incomplete combustion region.

4. A method according to claim 1, wherein said combustion flame contains an excess-oxygen combustion region and part of the substrate for diamond deposition is disposed in the excess-oxygen combustion region to effect deposition of diamond on said substrate.

5. A method according to claim 1, wherein said raw material compound for diamond deposition contains oxygen and is burned in an atmosphere containing oxygen to form said combustion flame in said atmosphere.

6. A method according to claim 1, wherein said raw material compound for diamond deposition contains no oxygen and is burned in an atmosphere containing oxygen to form said combustion flame in said atmosphere.

7. A method according to claim 1, wherein the temperature of deposition of diamond on the substrate is in the range of 600° to 1,200° C.

8. A method according to claim 1, wherein the carbon source in said raw material for diamond deposition is at least one member selected from the group consisting of methane, ethane, propane, acetylene, butane, ethylene, methyl alcohol, ethyl alcohol, and benzene.

* * * * *

UNITED STATES PATENT AND TRADEMARK OFFICE
CERTIFICATE OF CORRECTION

PATENT NO. : 4,938,940
DATED : July 3, 1990
INVENTOR(S) : YOICHI HIROSE ET AL

It is certified that error appears in the above-identified patent and that said Letters Patent is hereby corrected as shown below:

Column 10, line 10, "contains" should read --is mixed with--;

lines 14-15, "contains no oxygen and is burned" should read --is burned without being mixed with oxygen--;

line 25, Claim 9 should be added as follows:

--9. A method according to Claim 1, wherein said raw material compound for diamond deposition is mixed with oxygen and is burned in an atmosphere containing no oxygen to form said combustion flame in said atmosphere.--

Signed and Sealed this

Seventh Day of January, 1992

Attest:

HARRY F. MANBECK, JR.

*Attesting Officer* — *Commissioner of Patents and Trademarks*